US009329929B2

(12) United States Patent
Jia et al.

(10) Patent No.: US 9,329,929 B2
(45) Date of Patent: May 3, 2016

(54) SOFT MAXIMUM LIKELIHOOD SEQUENCE ESTIMATION IN DIGITAL COMMUNICATION

(71) Applicant: ZTE (USA) Inc., Morristown, NJ (US)

(72) Inventors: Zhensheng Jia, Morganville, NJ (US); Yi Cai, Jackson, NJ (US)

(73) Assignee: ZTE (USA) Inc., Austin, TX (US)

( * ) Notice: Subject to any disclaimer, the term of this patent is extended or adjusted under 35 U.S.C. 154(b) by 0 days.

(21) Appl. No.: 14/220,037

(22) Filed: Mar. 19, 2014

(65) Prior Publication Data

US 2014/0289589 A1 Sep. 25, 2014

Related U.S. Application Data

(60) Provisional application No. 61/803,778, filed on Mar. 20, 2013.

(51) Int. Cl.
*H03M 13/00* (2006.01)
*G06F 11/10* (2006.01)
*H03M 13/25* (2006.01)
*H04L 1/00* (2006.01)

(52) U.S. Cl.
CPC ............ *G06F 11/10* (2013.01); *H03M 13/256* (2013.01); *H04L 1/0047* (2013.01); *H04L 1/0054* (2013.01)

(58) Field of Classification Search
CPC ..... G06F 11/10; H03M 13/256; H04L 1/0054
See application file for complete search history.

(56) References Cited

U.S. PATENT DOCUMENTS

| | | | |
|---|---|---|---|
| 5,809,090 A * | 9/1998 | Buternowsky et al. | 375/347 |
| 5,812,334 A * | 9/1998 | Behrens et al. | 360/40 |
| 6,226,323 B1 * | 5/2001 | Tan et al. | 375/233 |
| 6,490,243 B1 * | 12/2002 | Tanaka et al. | 370/216 |
| 6,842,495 B1 * | 1/2005 | Jaffe et al. | 375/326 |
| 7,027,537 B1 * | 4/2006 | Cheong et al. | 375/348 |
| 8,041,233 B2 | 10/2011 | Hueda et al. | |
| 8,156,397 B2 * | 4/2012 | Heiman et al. | 714/746 |
| 8,379,709 B2 | 2/2013 | Hui et al. | |
| 8,488,726 B2 | 7/2013 | Hueda et al. | |
| 8,649,453 B2 | 2/2014 | Hui et al. | |
| 2005/0177860 A1 * | 8/2005 | Goyal et al. | 725/118 |
| 2005/0280568 A1 | 12/2005 | Rowland et al. | |
| 2006/0056547 A1 | 3/2006 | Buchali et al. | |
| 2006/0274861 A1 | 12/2006 | Langenbach et al. | |

(Continued)

FOREIGN PATENT DOCUMENTS

WO 2007/021952 A2 2/2007

OTHER PUBLICATIONS

Jia, Z., et al., "Experimental demonstration of iterative post-equalization algorithm for 37.5-Gbaud PM-16QAM quad-carrier Terabit superchannel," Optics Express, 23(3):2157-2162, Feb. 2015.

(Continued)

*Primary Examiner* — Esaw Abraham
(74) *Attorney, Agent, or Firm* — Perkins Coie LLP

(57) ABSTRACT

A digital communication receiver generates soft decision values at the output of a maximum likelihood sequence estimator module. The values are fed into a following forward error correction module that uses the soft-decision input signal to improve error correction performance. The disclosed techniques can be used for receiving optical signals in an optical communication network.

16 Claims, 12 Drawing Sheets

(56) References Cited

U.S. PATENT DOCUMENTS

| | | | |
|---|---|---|---|
| 2008/0199191 A1 | 8/2008 | Essiambre et al. | |
| 2009/0110124 A1* | 4/2009 | Fatemi-Ghomi et al. | 375/341 |
| 2009/0177945 A1 | 7/2009 | Djordjevic et al. | |
| 2009/0225899 A1 | 9/2009 | Dent | |
| 2009/0285278 A1 | 11/2009 | Mamaril et al. | |
| 2010/0202504 A1 | 8/2010 | Murali et al. | |
| 2012/0068748 A1* | 3/2012 | Stojanovic et al. | 327/161 |
| 2013/0138375 A1 | 5/2013 | Zhou et al. | |
| 2014/0325319 A1 | 10/2014 | Cai et al. | |
| 2016/0020857 A1 | 1/2016 | Jia et al. | |

OTHER PUBLICATIONS

Cai, Y., et al., "On turbo Code Decoder Performance in Optical-Fiber Communication Systems With Dominating ASE noise," Journal of Lightwave Technology, 21(3):727-734, Mar. 2003.

Djordjevic, I.B., et al., "Achievable Information Rates for High-Speed Long-Haul Optical Transmission," Journal of Lightwave Technology, 23(11):3755-3763, Nov. 2005.

Djordjevic, I.B., et al., "Suppression of Fiber Nonlinearities and PMD in Coded-Modulation Schemes With Coherent Detection by Using Turbo Equalization," Journal of Optical Communications and Networking, 1(6):555-564, Nov. 2009.

European Search Report mailed on Aug. 26, 2014 for European Application No. 14160741.6, filed Mar. 19, 2014 (5 pages).

Forney, G.D., Jr., "Maximum-Likelihood Sequence Estimation of Digital Sequences in the Presence of Intersymbol Interference," IEEE Transactions on Information Theory, IT-18(3)363-378, May 1972.

Hui, D., et al., "Maximum Likelihood Sequence Estimation in the Presence of Constant Envelope Interference," IEEE 58th Vehicular Technology Conference, 2003 (VTC 2003-Fall), vol. 2, pp. 1060-1064, Oct. 2003.

European Search Report mailed on Dec. 14, 2015 for European Application No. 15275173.1, filed Jul. 13, 2015 (8 pages).

European Search Report mailed on Feb. 19, 2016 for European Application No. 15275211.9, filed Oct. 7, 2015 (12 pages).

Fatadin, I., et al., "Carrier Phase Recovery for 16-QAM Using QPSK Partitioning and Sliding Window Averaging," IEEE Photonics Technology Letters, 26(9):854-857, May 2014.

Gao, Y., et al., "Low-Complexity Two-Stage Carrier Phase Estimation for 16-QAM Systems using QPSK Partitioning and Maximum Likelihood Detection," Optical Fiber Communication Conference/National Fiber Optic Engineers Conference 2011, OSA Technical Digest (CD) (Optical Society of America, 2011), paper OMJ6, 3 pages, Mar. 2011.

* cited by examiner

SOFT MAXIMUM LIKELIHOOD SEQUENCE ESTIMATION IN DIGITAL COMMUNICATION

CROSS REFERENCE TO RELATED APPLICATIONS

This patent document claims the benefit of priority of U.S. Provisional Patent Application No. 61/803,778, filed on Mar. 20, 2013. The entire content of the before-mentioned patent application is incorporated by reference as part of the disclosure of this document.

BACKGROUND

This patent document relates to receiving error correction coded digital communication signals.

There is an ever-growing demand for data communication in application areas such as wireless communication, fiber optic communication and so on. The demand on core networks is especially higher because not only are user devices such as smartphones and computers using more and more bandwidth due to multimedia applications, but also the total number of devices for which data is carried over core networks is increasing.

SUMMARY

In some disclosed embodiments, a soft decision maximum likelihood sequence estimation (MLSE) technique is used to estimate received demodulated signal data prior to forward error decoding. A trellis structure is used to generate a soft value and a hard value decision for the received sample values. A hard decision about the received data bits is performed using the results of the trellis computations.

In one example aspect, the disclosed technology includes a method of and an apparatus for recovering information bits from a received signal in which information bits are encoded using a forward error correction code include generating a plurality of digital samples from the received signal, performing a maximum likelihood sequence estimation (MLSE) on the plurality of digital samples to generate a plurality of hard decision values and a plurality of soft decision values corresponding to the plurality of hard decision values, and recovering information bits by forward error correcting the plurality of un-error-corrected data bits.

In another example aspect, a method of generating sample value estimates from a plurality of symbol values representing a signal received over a transmission channel, each symbol in the plurality of symbols having a transmitted value from a set of reference symbol values includes generating a trellis model comprising one or more states, each state represented as a set of nodes corresponding to the set of reference symbol values such that, between two consecutive states, each node from a previous state is connected to each node in a next state by a path having a metric representing a likelihood of transition and estimating a first set of values representative of output sample values based on an absolute value of a difference of minimum path metric between reference symbols of consecutive states. This technique may be implemented in a communication receiver comprising an instruction memory and a processor that executes code from the memory to implement the technique.

DETAILED DESCRIPTION

Figure 1:
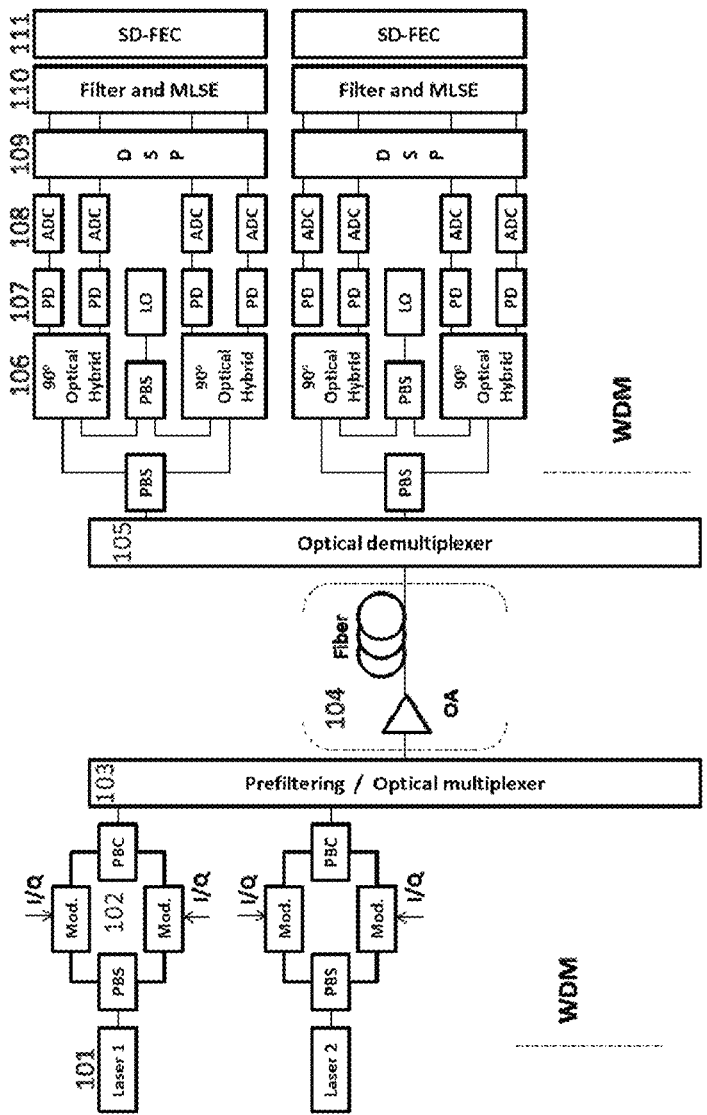
FIG. 1 shows a prefiltering/Nyquist WDM transmission system with coherent detection.

An example of a prefiltering or Nyquist WDM transmission system with coherent detection is shown in FIG. 1. The lightwave generated laser (101) is split by a polarization beam splitter (PBS) and individually modulated by a QPSK optical modulator, and then combined with a polarization beam combiner (PBC) to realize polarization multiplexed QPSK modulation (102). This NRZ-QPSK modulation can be realized by cascaded serial or parallel modulators. Then, optical multiplexer (103) with narrow-band optical filtering function is used to perform aggressive spectrum shaping and multiplexing function to obtain Nyquist (symbol bandwidth=channel spacing) or faster-than Nyquist WDM signals (symbol bandwidth<channel spacing). The transmission link (104) is uncompensated for chromatic dispersion (CD) with the consisting of optical amplifier (OA) and fiber at each span. After transmission, the optical demultiplexer (105) is used to demultiplex the WDM channels to the coherent detection. At the receiver side, LO signal after PBS is launched into the 90° optical hybrid (106) with the polarization split incoming transmitted signal. The diversified signals are sent to photodiode (PD) (107) and digitally sampled with analog-to-digital converter (ADC) (108). The regular digital signal processing unit (109) is then followed to compensate the optical front end (106 and 107) distortion, and then equalize the static and dynamic linear impairments, timing and carrier recovery.

Figure 2:
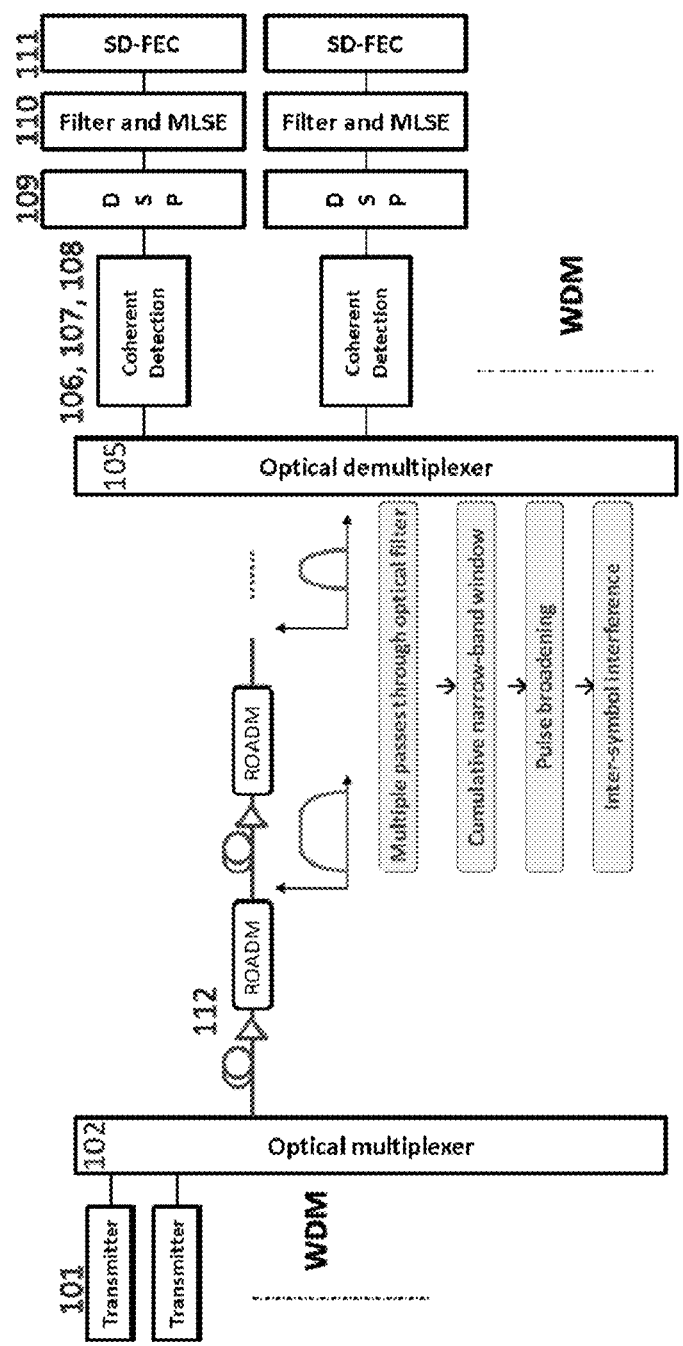
FIG. 2 shows a multiple cascaded ROADM transmission system with coherent detection.

To facilitate ease of optical networking, tolerance of spectrum narrowing is useful, as signal channel spacing is degraded after transmission through optical channel, especially when reconfigurable optical add/drop multiplexers (ROADMs) (112) nodes are used in the network as the second example of an embodiment shown in FIG. 2. Spectrum narrowing severely induces ISI between continually transmitted sequences.

Figure 3:
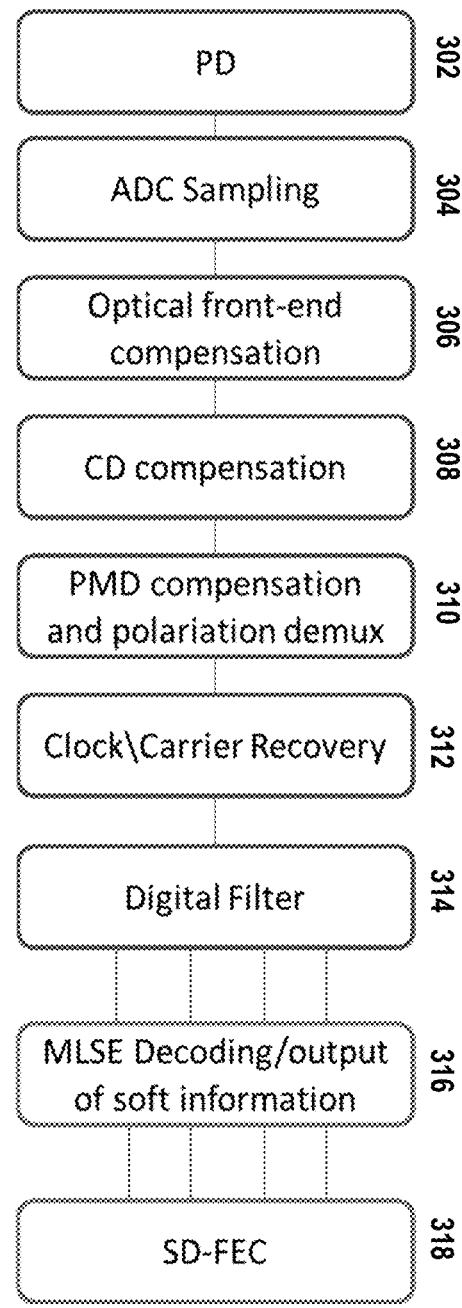
FIG. 3 shows an exemplary embodiment of DSP process.

A conventional DSP (digital signal processing) algorithm using adaptive decision feed forward equalizer is an inefficient solution for the particular ISI compensation, since this finite impulse response (FIR) filter enhances noise during compensation of spectrum narrowing. In addition to the regular DSP in conventional coherent detection, additional digital filter and maximum likelihood sequence estimation (MLSE)

algorithm are used to suppress noise and crosstalk to realize optimum detection (110) in strong filtering channels. FIG. 3 depicts an example of a detailed process procedure. The MLSE-based method has been successfully proved to mitigate ISI. To further improve the system performance, SD FEC (soft decision forward error code) can be used by insertion of a suitable error correction code into a transmitted data stream to facilitate detection and correction of data errors. In SD FEC, multiple bit "soft" information is generated that represents a confidence level or reliability of the received data (e.g., whether a bit is very likely one, likely one, likely zero, or most likely zero). To implement SD-FEC decoding, the MLSE may generate the "soft" data stream in combination with the conventional "hard" information. The reliability calculation in the MLSE process is based on the calculated path metrics with maximum probability criterion in the Viterbi algorithm.

The various functional modules in FIG. 3 are as follows: polarization detector (PD) 302 that detects polarization multiplexed signals, an analog-to digital (ADC) sampling stage 304, a stage 306 that compensates for imperfections (e.g., non-linearity) in the optical front-end, a stage for carrier frequency detection/compensation 308, a stage that compensates for polarization mode dispersion (PMD) and demultiplexes the polarized signals 310, a clock/carrier recovery stage 312, a digital filter 314 a stage that performs MLSE decoding and computer output of soft information 316 and a module that performs soft decision forward error correction (SD-FEC) 318, as described in the present document.

Figure 4:
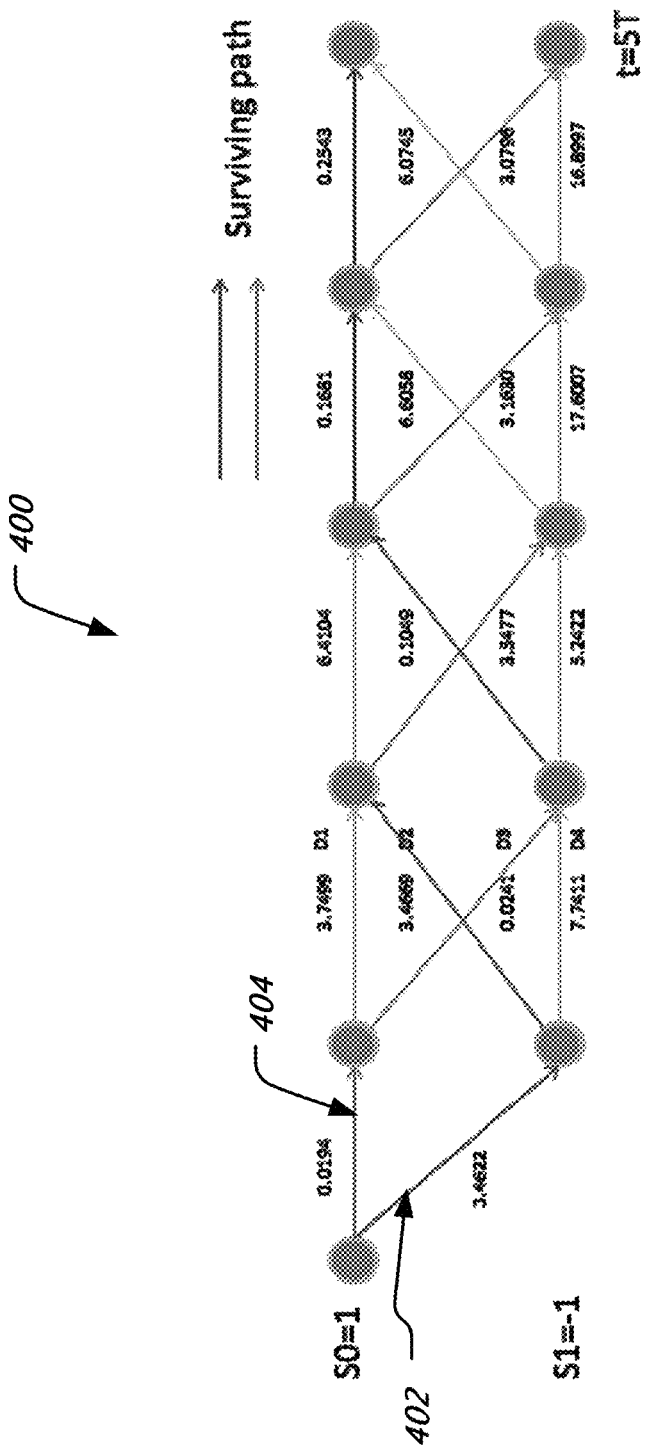
FIG. 4 shows soft output calculation in a maximum likelihood sequence estimation (MLSE) trellis structure.

FIG. 4 depicts the calculation of soft values in MLSE trellis structure 400. The example structure has a memory length of 2, alphabet set of $\{-1, 1\}$ and, thus, 2 states and 4 possible transitions between two consecutive states. Each trellis branch indicates a possible state transition labeled with a calculated path metric. The path metric represents the likelihood of the corresponding state transition. In the example, a smaller value of the path metric represents a higher likelihood of the corresponding state transition. The MLSE process is to find the surviving path (402 or 404) of a giving trellis that corresponds to the sequence estimation with maximum likelihood. The soft value discussed in the present document can be calculated based on the 4 branch metrics (D1, D2, D3, D4) between each two consecutive states as:

$$\text{Soft Value} = \text{abs}(\min(D3, D1) - \min(D2, D4)) \quad \text{Equation (1)}$$

After finding a surviving path, the corresponding states along the surviving path are the MLSE hard decisions. Combining the hard decisions and the corresponding soft values, we can generate MLSE soft decisions as $$\text{Soft Decision Output} = \text{Soft Value}.\text{*Hard Decision}. \quad \text{Equation (2)}$$

Figure 5:
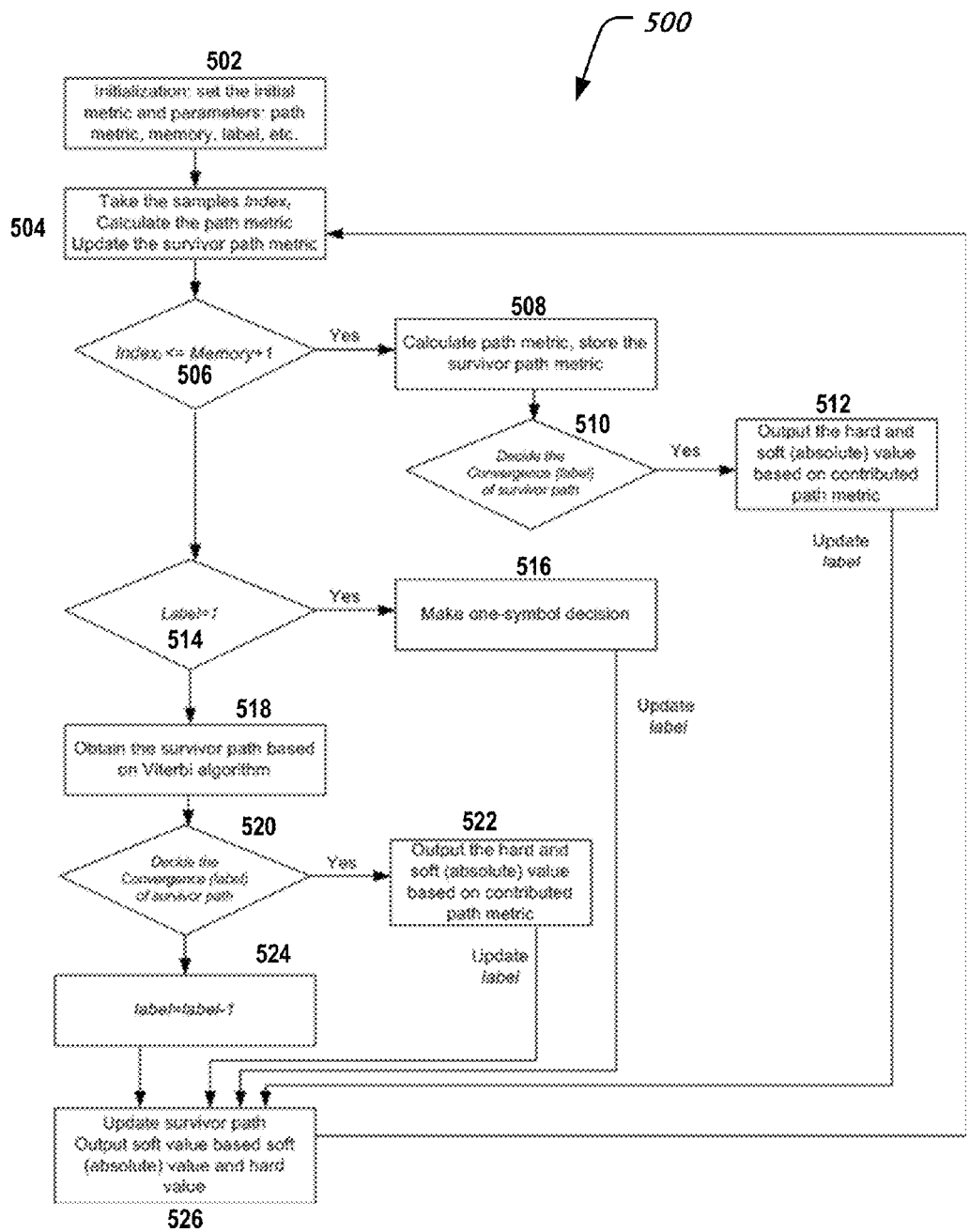
FIG. 5 shows the generation of soft and hard decision values in an MLSE process.

FIG. 5 shows an example of a procedure 500 of calculating path metric and generating soft decision values in the MLSE process. After the initialization stage (502), the memory is firstly filled with sample values while the convergence state is decided to export the soft/hard value or not in the current bit. An Index, number of samples are taken in (504), until memory is filled (506). In some embodiments, 22 bits may be used to fill the memory.

Path metric for each transition from nodes of a previous state (e.g., representing possible values of sample values) is calculated (508). The survivor path metric (e.g., as used in a soft Viterbi decoder) is updated.

Next, the label pointing to the converged bit is updated. The next operation is to evaluate the label to decide if one-symbol decision is needed if no convergence appears in the memory 9514, 516). Then the basic Viterbi algorithm is employed and the soft/hard values are continually exported after the decision on the convergence state evaluation. The label is the identifier pointing to the converged bit in the memory, where the soft value is calculated and output. The number of states and transitions may in general be related to properties of transmission channel. For example, for a channel that may cause longer bit error bursts, a greater number of stages may be used.

As further shown in FIG. 5, survivor path updating and outputting of soft value based on soft value and hard value (526) may be performed either by outputting hard and soft (absolute) value based on contributed path metric (512) upon deciding the convergence (label) of the survivor path (510) or (522) when decided (520) after deciding the survivor path based on Viterbi algorithm (518), as described above. Upon decoding the convergence (520), value of label is reduced by one (524).

Figure 6:
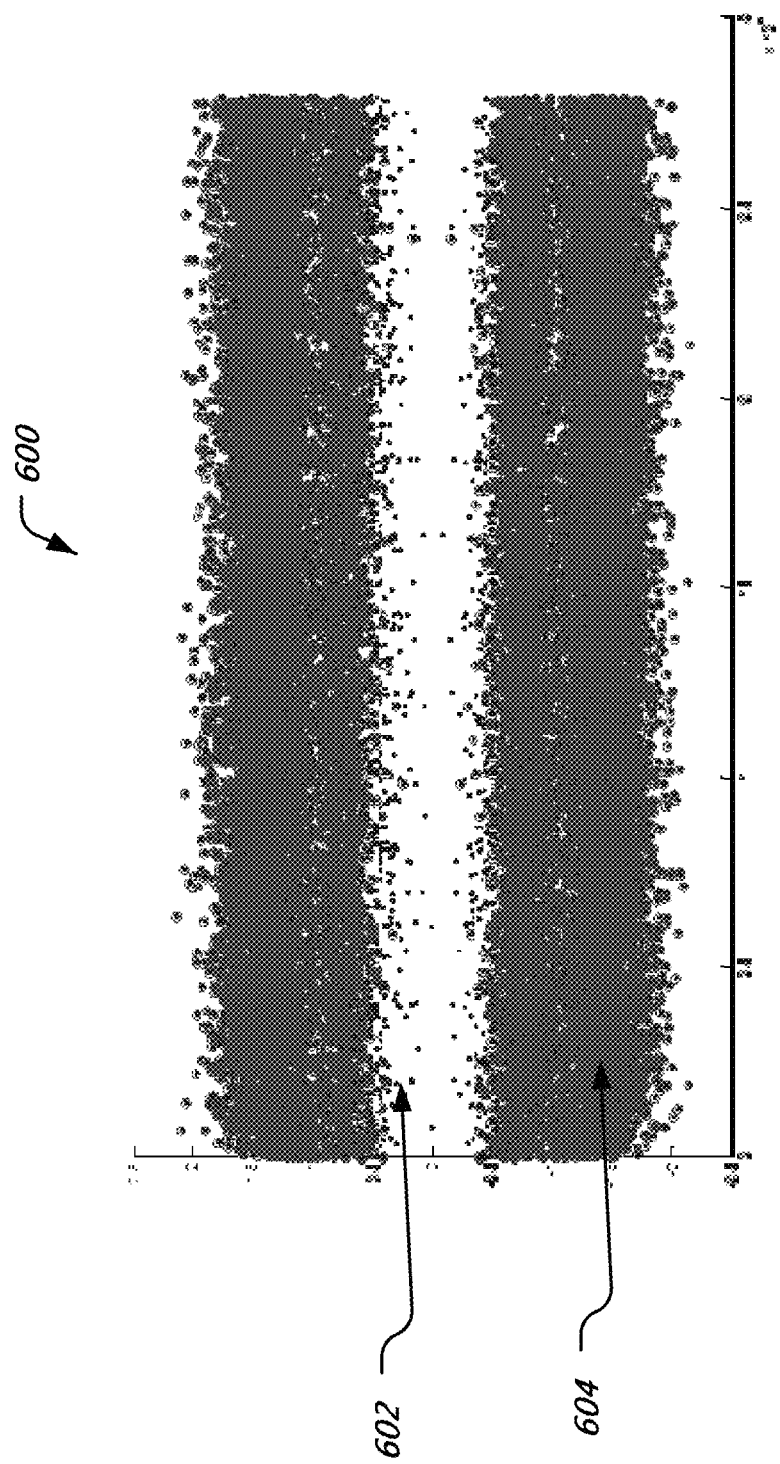
FIG. 6 shows exemplary results of soft MLSE output values generated using different MLSE memory lengths.

With respect to FIG. 6, two examples of the MLSE soft decision values resulted from the invented method are shown in graph 600 of FIG. 6, which correspond respectively to an MLSE memory length of 3 (602) and 12 (604). It shows that the case with longer MLSE memory length (number of trellis stages) results in more converged bit decisions, then less number of soft decision values close to 0 for the alphabet set of $\{-1, 1\}$. In other word, using longer MLSE memory size helps to improve the reliability (or certainty) of the MLSE decisions.

Figure 7:
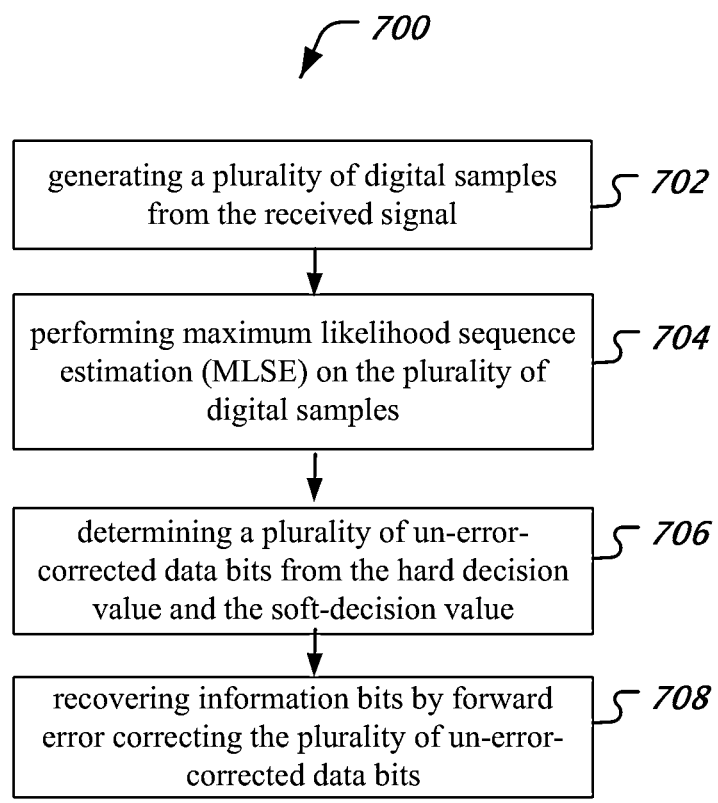
FIG. 7 is a flowchart representation of a process of receiving and decoding digital signals.

FIG. 7 is a flowchart representation of a process 700 of recovering information bits from a received signal in which information bits are encoded using a forward error correction code. The process 700 can be implemented at a wireless or an optical receiver apparatus.

At 702, a plurality of digital samples are generated from the received signal. The process 700 may generate the plurality of digital samples using the previously discussed techniques with respect to the PD to digital filter modules (refer to FIG. 3, 314).

At 704, the process 700 performs an MLSE on the plurality of digital samples to generate a plurality of hard decision values and a plurality of soft decision values based on the plurality of hard decision values. As previously disclosed, the hard decision values may, e. g., provide a decision output that belongs to a known set of input symbol values (e.g., +1 or −1 in case of a QPSK input). In some implementations, the soft decision values may include a value and a corresponding confidence level of how probable that value is. The final soft-decision output is generated based on the hard-decision values for sign and soft decision values through Equation (2).

At 706, the process 700 determines a plurality of un-error-corrected data bits from the plurality of soft-decision output values. The un-error-corrected data bits, e.g., may be the result of MLSE processing prior to performing FEC decoding on these values to eliminate any bit errors that can be detected and/or corrected using an error correction code.

At 708 the process 700 recovers information bits by soft-decision forward error correcting the plurality of un-error-corrected data bits. In some implementations, the recovered information represents the data bits that were used to modulate/encode information at the transmitter side.

Figure 8:
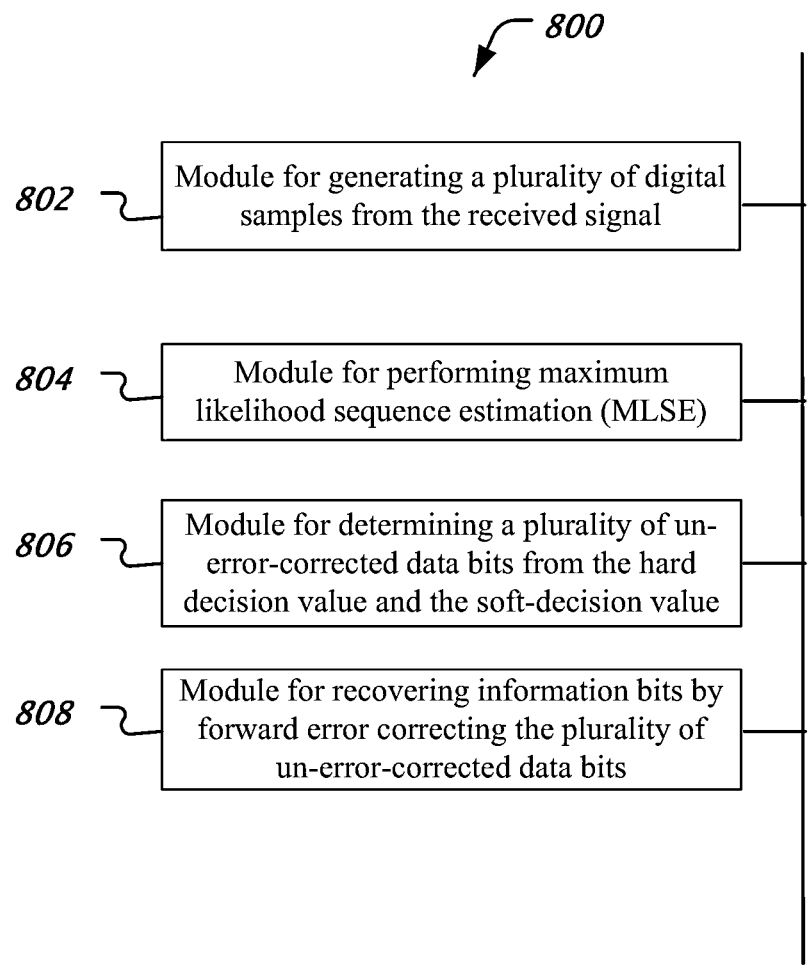
FIG. 8 is a block diagram representation of a digital receiver.

FIG. 8 is a block diagram representation of an apparatus 800 for recovering information bits from a received signal in which information bits are encoded using an forward error correction code. The module (e.g., a receiver subsystem comprising functional modules PD to digital filter in FIG. 3) 802 is for generating a plurality of digital samples from the received signal. The module 804 (e.g., an MLSE module) is for performing a maximum likelihood sequence estimation (MLSE) on the plurality of digital samples to generate a plurality of hard decision values and a plurality of soft decision values corresponding to the plurality of hard decision values. The module 806 (e.g., an MLSE output module) is for determining a plurality of un-error-corrected data bits from the plurality of hard decision values and the plurality of soft-decision values. The module 808 (e.g., an error correction module) is for recovering information bits by forward error correcting the plurality of un-error-corrected data bits.

Figure 9:
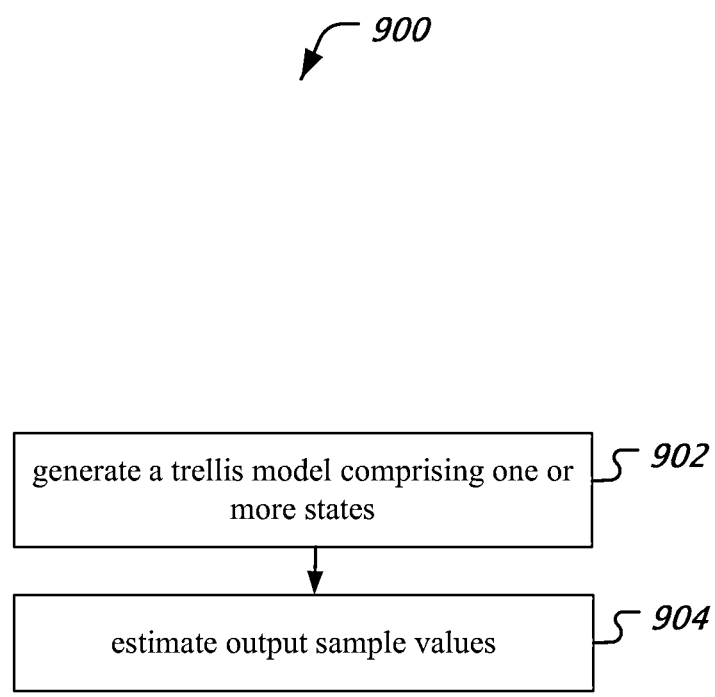
FIG. 9 is a flowchart representation of a process of receiving and decoding digital signals.

FIG. 9 is a flowchart representation of a process 900 of generating sample value estimates from a plurality of symbol values representing a signal received over a transmission channel, each symbol in the plurality of symbols having a transmitted value from a set of reference symbol values. The process 900 can be implemented, e.g., in an optical receiver or a wireless receiver.

At 902, the process 900 generates a trellis model comprising one or more states, each state each state represented as a set of nodes corresponding to the set of reference symbol values such that, between two consecutive states, each node from a previous state is connected to each node in a next state by a path having a metric representing a likelihood of transition. One example of a trellis model is disclosed above with respect to FIG. 4.

At 904, the process 900 estimates a first set of values representative of output sample values based on an absolute value of a difference of minimum path metric between reference symbols of consecutive states. One example of the estimation is discussed above with respect to Equation (1).

Figure 10:
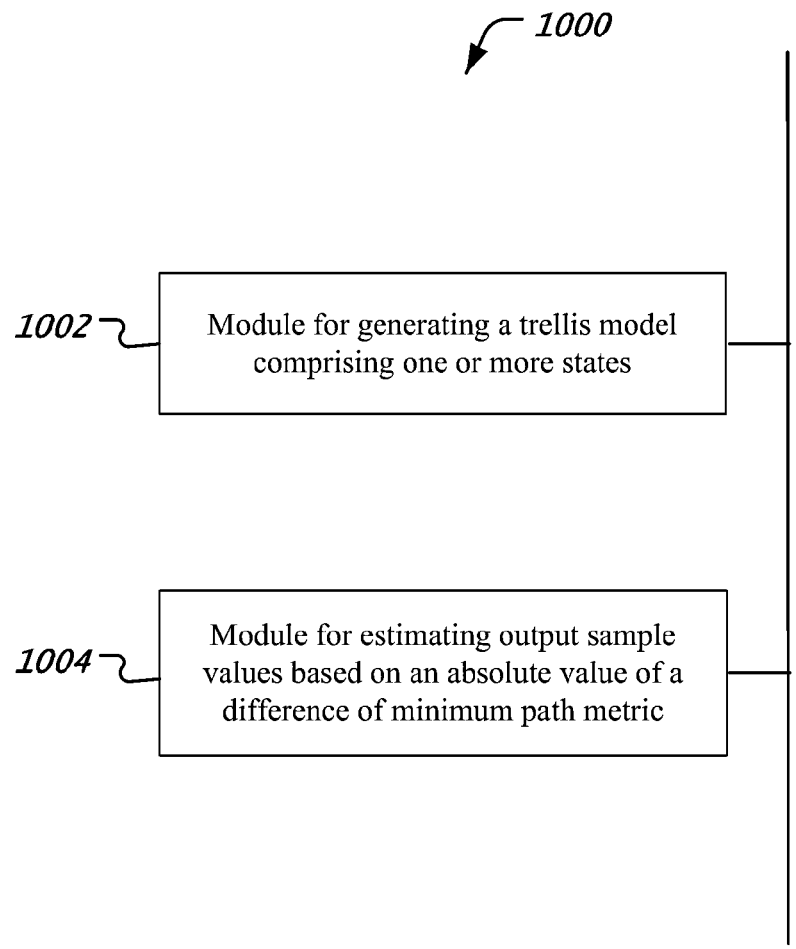
FIG. 10 is a block diagram representation of a digital receiver.

FIG. 10 is a block diagram representation of an apparatus 1000 for generating sample value estimates from a plurality of symbol values representing a signal received over a transmission channel, each symbol in the plurality of symbols having a transmitted value from a set of reference symbol values. The module 1002 is for generating a trellis model comprising one or more states, each state each state represented as a set of nodes corresponding to the set of reference symbol values such that, between two consecutive states, each node from a previous state is connected to each node in a next state by a path having a metric representing a likelihood of transition. The module 1004 is for estimating a first set of values representative of output sample values based on an absolute value of a difference of minimum path metric between reference symbols of consecutive states.

In some implementations, an optical signal receiver includes a signal reception module configured to generate symbol estimates based on input digitized signal values of a duo-binary optical signal. The signal reception module includes a trellis structure having a memory length of two, an alphabet set of two values and corresponding four transition paths from a previous state of two values to a next state of two values, in which a soft value of a symbol is computed using Equation (1) wherein abs represents an absolute value function and D1 and D3 represent transition path metrics from a first alphabet value in the previous state to the two alphabet values in the next state and D2 and D4 represent transition path metrics from a second alphabet value in the previous state to the two alphabet values in the next state.

In some implementations, an optical communication system includes an optical signal transmitter configured to transmit an error correction coded optical signal and an optical signal receiver configured to receive the error correction coded optical signal, generate a plurality of digital samples from the received signal, perform a maximum likelihood sequence estimation (MLSE) on the plurality of digital samples to generate a plurality of hard decision values and a plurality of soft decision values corresponding to the plurality of hard decision values, determine a plurality of un-error-corrected data bits from the plurality of hard decision values and the plurality of soft-decision values and recover information bits by forward error correcting the plurality of un-error-corrected data bits.

Figure 11:
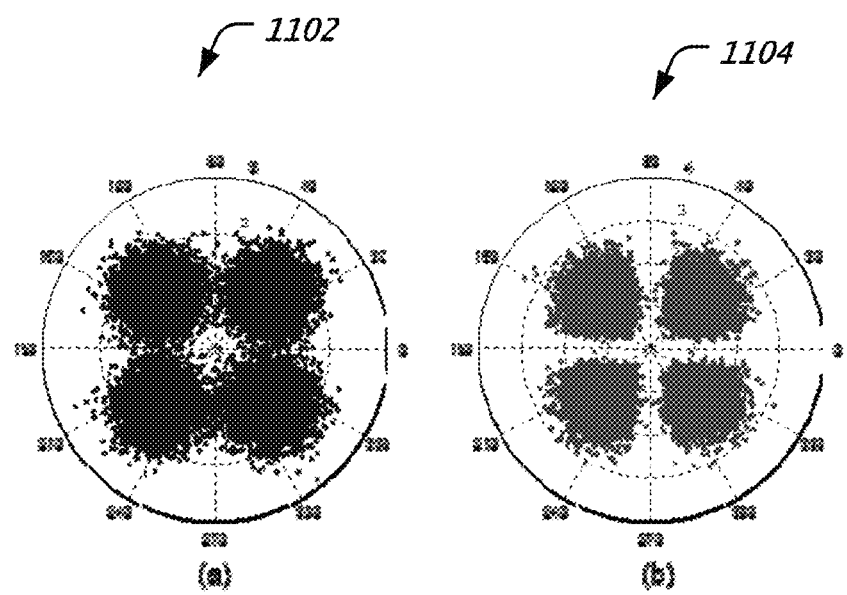
FIG. 11 depicts examples of constellations before and after soft-decision MLSE recovery.

FIG. 11 depicts an example of constellations before (1102) and after (1104) soft-decision MLSE recovery.

As an example of $3^{rd}$-order 25-GHz bandwidth constrained 128-Gb/s PDM-QPSK signal, FIG. 11 shows complex constellations before (1102) and after (1104) digital filter and soft-decision MLSE recovery. The number of points at the neighboring regions of each quadrant is much less compared with the one without soft process of MLSE.

Figure 12:
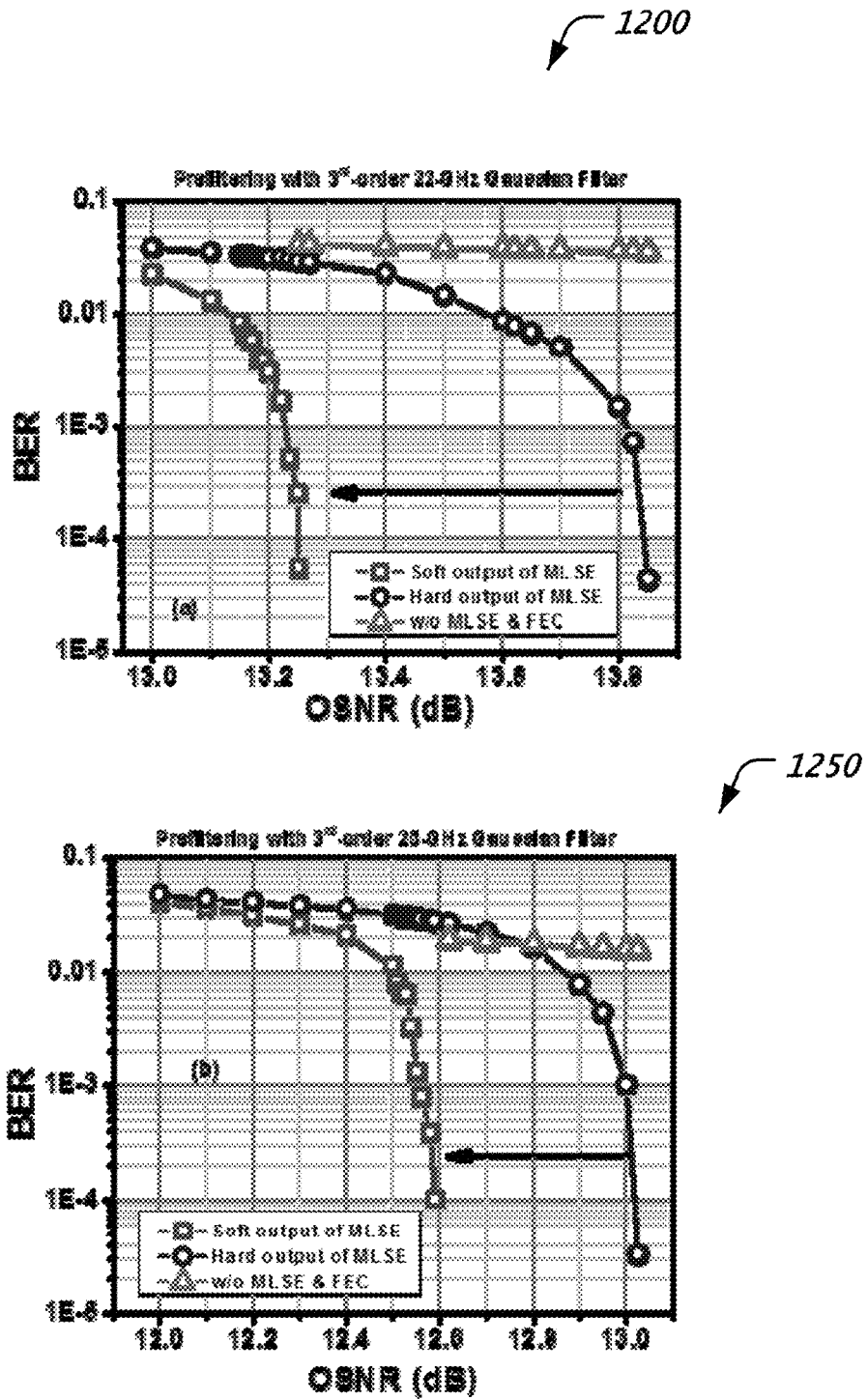
FIG. 12 depicts example graphs of bit error rate (BER) performances of soft and hard output of MLSE w/SD FEC (forward error correction) as a function of OSNR; spectral prefiltering with (a) $3^{rd}$-order 22-GHz optical Gaussian filter; (b) $3^{rd}$-order 25-GHz optical Gaussian filter.

With reference to FIG. 12, a TPC SD-FEC code is used to verify the effectiveness of the disclosed technology of generating soft values from MLSE. The code rate is 0.8308 and the length of coded bits is 110592. Half million data points are used to investigate the water-fall region of FEC decoding algorithm. Graph 1200 shows the BER performance comparisons of soft and hard output of MLSE with SD FEC as well as the one without both MLSE and FEC in the case of spectral prefiltering with 3rd-order 22-GHz optical Gaussian filter. About 0.6-dB OSNR improvement has been achieved with the use of soft value that is generated in the depicted embodiment. The embodiment that employs both soft output of MLSE and SD FEC provides the best BER performance and enables the possibility of implementations in such spectral-narrowing condition.

The disclosed and other embodiments, modules and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is what is described and illustrated, including:

1. A method of recovering information bits from a received optical signal in which information bits are encoded using a forward error correction code, the method comprising:
    generating, by an optical signal receiver, a plurality of digital samples of the received optical signal;
    performing a maximum likelihood sequence estimation (MLSE) through a trellis structure on the plurality of digital samples to generate a plurality of hard decision values and a plurality of soft values corresponding to the plurality of hard decision values,
    generating a plurality of soft decision outputs by multiplying the plurality of hard decision values with the corresponding soft values; and
    recovering information bits by forward error correcting the plurality of soft decision outputs.

2. The method of claim 1, wherein the generation of the plurality of soft values comprises:
    processing the plurality of digital samples through the trellis structure comprising one or more stages, wherein each stage comprises a set of soft values based on an absolute value of a difference of minimum path metric values between consecutive stages.

3. The method of claim 2, wherein the path metric values represent a likelihood of the corresponding stage transitions.

4. The method of claim 1, wherein the generation of the plurality of hard decision values comprises:
    finding a surviving path in the trellis structure and setting the corresponding states along the surviving path as MLSE hard decision values.

5. A computer program product comprising a non-transitory computer-readable program medium having code stored thereon, the code, when executed, causing a processor to implement a method of recovering data from a received signal in which information bits are encoded using an forward error correction code, the method comprising:
    generating a plurality of digital samples from the received signal;
    performing a maximum likelihood sequence estimation (MLSE) through a trellis structure on the plurality of digital samples to generate a plurality of hard decision values and a plurality of soft values corresponding to the plurality of hard decision values;
    generating a plurality of soft decision outputs by multiplying the plurality of hard decision values with the corresponding soft values; and
    recovering information bits by forward error correcting the plurality of soft decision outputs.

6. The computer program product of claim 5, wherein the generation of the plurality of soft values comprises:
    processing the plurality of digital samples through the trellis structure comprising one or more stages, wherein each stage comprises a set of soft values based on an absolute value of a difference of minimum path metric values between consecutive stages.

7. The computer program product of claim 6, wherein the path metric values represent a likelihood of the corresponding stage transitions.

8. The computer program product of claim 5, wherein the generation of the plurality of hard decision values comprises:
    finding a surviving path in the trellis structure and setting the corresponding states along the surviving path as hard decision values.

9. An apparatus, at least partially implemented on hardware, for recovering information bits from a received optical signal in which information bits are encoded using an forward error correction code, the apparatus comprising:
    a receiver subsystem that generates a plurality of digital samples from the received optical signal;
    a maximum likelihood sequence estimation (MLSE) module that performs MLSE through a trellis structure on the plurality of digital samples to generate a plurality of hard decision values and a plurality of soft values corresponding to the plurality of hard decision values, and further generate a plurality of soft decision outputs by multiplying the plurality of hard decision values with the corresponding soft values; and an error correction module that recovers information bits by forward error correcting the plurality of soft decision outputs.

10. The apparatus of claim 9, wherein the MLSE module comprises:
a trellis module that processes the plurality of digital samples through the trellis structure comprising one or more stages, wherein each stage comprises a set of soft values based on an absolute value of a difference of minimum path metric values between consecutive stages.

11. The apparatus of claim 10 wherein the path metric values indicate a likelihood of the corresponding stage transitions.

12. The apparatus of claim 9, wherein the generation of the plurality of hard decision values comprises:
finding a surviving path in the trellis structure and setting the corresponding states along the surviving path as hard decision values.

13. An optical communication system comprising:
an optical signal transmitter configured to transmit an error correction coded optical signal; and
an optical signal receiver configured to:
receive the error correction coded optical signal;
generate a plurality of digital samples from the received signal;
perform a maximum likelihood sequence estimation (MLSE) through a trellis structure on the plurality of digital samples to generate a plurality of hard decision values and a plurality of soft values corresponding to the plurality of hard decision values;
generate a plurality of soft decision outputs by multiplying the plurality of hard decision values with the corresponding soft values; and
recover information bits by forward error correcting the plurality of soft decision outputs.

14. The optical communication system of claim 13, wherein the performing the MLSE comprises:
processing the plurality of digital samples through the trellis structure comprising one or more stages, wherein each stage comprises a set of soft values based on an absolute value of a difference of minimum path metric values between consecutive stages.

15. The optical communication system of claim 14, wherein the path metric values indicate a likelihood of corresponding stage transitions.

16. The optical communication system of claim 13, wherein the generation of the plurality of hard decision values comprises:
finding a surviving path in the trellis structure and setting the corresponding states along the surviving path as hard decision values.

* * * * *